(12) United States Patent
Kim et al.

(10) Patent No.: US 10,366,732 B2
(45) Date of Patent: Jul. 30, 2019

(54) SEMICONDUCTOR DEVICE

(71) Applicant: SK hynix Inc., Icheon-si, Gyeonggi-do (KR)

(72) Inventors: Woongrae Kim, Icheon-si (KR); Sangkwon Lee, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/653,026

(22) Filed: Jul. 18, 2017

(65) Prior Publication Data

US 2018/0277178 A1 Sep. 27, 2018

(30) Foreign Application Priority Data

Mar. 27, 2017 (KR) .................. 10-2017-0038477

(51) Int. Cl.
*G11C 5/00* (2006.01)
*G11C 7/10* (2006.01)
*G06F 1/3234* (2019.01)
*G11C 7/22* (2006.01)
*G11C 7/06* (2006.01)
*G11C 5/14* (2006.01)

(52) U.S. Cl.
CPC ............ *G11C 7/1057* (2013.01); *G06F 1/325* (2013.01); *G11C 5/148* (2013.01); *G11C 7/062* (2013.01); *G11C 7/222* (2013.01)

(58) Field of Classification Search
CPC ........................................................ G11C 5/00
USPC ................................................. 365/233, 226
See application file for complete search history.

(56) References Cited

U.S. PATENT DOCUMENTS 6,594,770 B1 7/2003 Sato et al.
2002/0191480 A1* 12/2002 Matsumoto .......... G11C 7/1078
365/233.1

FOREIGN PATENT DOCUMENTS

KR 100269313 B1 12/2000

\* cited by examiner

*Primary Examiner* — Jason Lappas
(74) *Attorney, Agent, or Firm* — William Park & Associaates Ltd.

(57) ABSTRACT

A semiconductor device includes a buffer control circuit suitable for generating a buffer control signal in response to a power-down mode signal and a detection pulse, a first buffer circuit suitable for generating a first internal chip select signal by buffering a chip select signal depending on a select signal which is generated in response to the buffer control signal in a power-down mode, and a detection pulse generation circuit suitable for generating the detection pulse in response to the first internal chip select signal.

11 Claims, 12 Drawing Sheets

SEMICONDUCTOR DEVICE

CROSS-REFERENCE TO RELATED APPLICATION

The present application claims priority under 35 U.S.C. § 119(a) to Korean Patent Application No. 10-2017-0038477 filed on Mar. 27, 2017 in the Korean Intellectual Property Office, which is incorporated herein by reference in its entirety.

BACKGROUND

1. Technical Field

Embodiments of the present disclosure relate to a semiconductor device which has a power-down mode.

2. Related Art

A semiconductor memory device has a power-down mode as one standby mode. The power-down mode is an operation mode in which power is applied but generation of an internal clock is interrupted to reduce power consumption. In the power-down mode, in order to reduce power consumption, it is important to limit an amount of leakage current.

SUMMARY

Various embodiments are directed to a semiconductor device which controls operation of a buffer in a power-down mode.

In an embodiment, a semiconductor device may include: a buffer control circuit suitable for generating a buffer control signal in response to a power-down mode signal and a detection pulse; a first buffer circuit suitable for generating a first internal chip select signal by buffering a chip select signal depending on a select signal which is generated in response to the buffer control signal, in a power-down mode; and a detection pulse generation circuit suitable for generating the detection pulse in response to the first internal chip select signal.

In an embodiment, a semiconductor device may include: a first buffer circuit suitable for generating a first internal chip select signal by buffering a chip select signal in the case where a select signal has a first logic level; a second buffer circuit suitable for generating a second internal chip select signal by buffering the chip select signal in the case where the select signal has a second logic level; a detection pulse generation circuit suitable for generating a detection pulse in response to the second internal chip select signal; and a buffer control circuit suitable for generating a buffer control signal in response to the detection pulse.

In an embodiment, a semiconductor device may include: a first buffer circuit suitable for generating a first internal chip select signal by buffering a chip select signal in a normal operation mode; a second buffer circuit suitable for generating a second internal chip select signal by buffering the chip select signal in a power-down mode; and a command address buffer circuit suitable for generating an internal command address by buffering a command address in the power-down mode, the power-down mode being entered in response to a power-down mode signal and being exited in response to a detection pulse generated in synchronization with an edge of the second internal chip select signal.

In an embodiment, a semiconductor device may include: a buffer control circuit suitable for generating a buffer control signal in response to a power-down mode signal and a power-down mode exit signal; a first buffer circuit suitable for generating a first internal chip select signal by buffering a chip select signal in response to the buffer control signal in a power-down mode; and a second buffer circuit suitable for generating a second internal chip select signal by buffering the chip select signal in response to the buffer control signal in a normal operation mode.

DETAILED DESCRIPTION

Hereinafter, a semiconductor device will be described below with reference to the accompanying drawings through various example embodiments.

Figure 1:
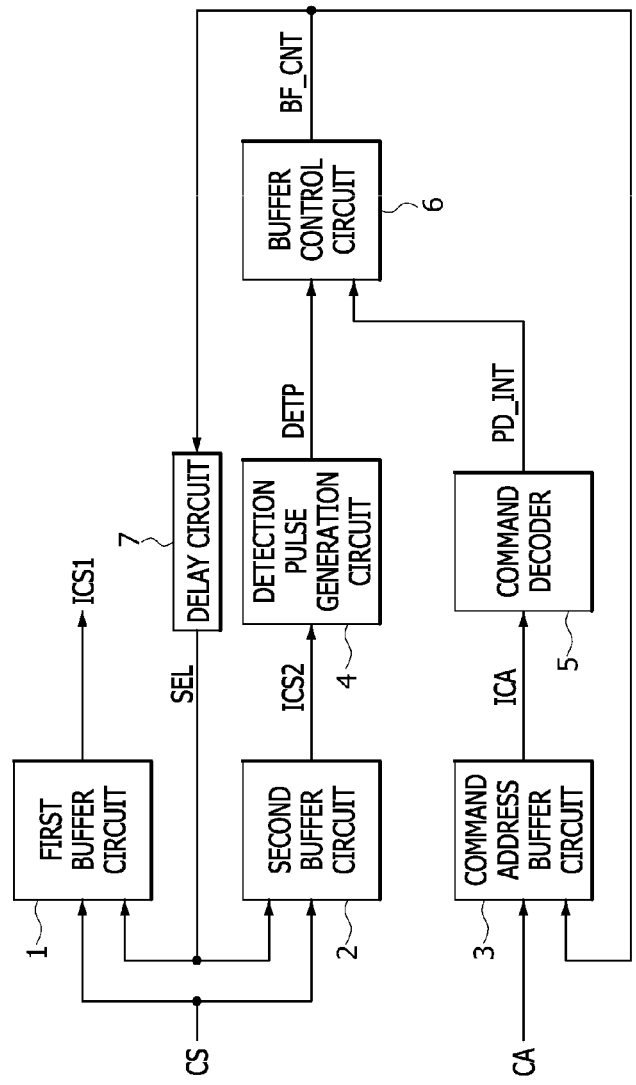
FIG. 1 is a block diagram illustrating a representation of an example of a configuration of a semiconductor device in accordance with an embodiment.

As shown in FIG. 1, a semiconductor device in accordance with an embodiment may include a first buffer circuit 1, a second buffer circuit 2, a command address buffer circuit 3, a detection pulse generation circuit 4, a command decoder 5, a buffer control circuit 6, and a delay circuit 7.

The first buffer circuit 1 may generate a first internal chip select signal ICS1 in response to a select signal SEL and a chip select signal CS. The first buffer circuit 1 may generate the first internal chip select signal ICS1 by buffering the chip select signal CS in a state in which the select signal SEL has a predetermined logic level such as a first logic level. The chip select signal CS may be a command which is enabled to select a chip (not shown) including the semiconductor device. According to an embodiment, the first buffer circuit 1 may buffer a command other than the chip select signal CS. The select signal SEL may have a first logic level in a normal operation mode and have a second logic level in a power-down mode. The normal operation mode may mean a mode excluding a low power consumption mode such as the power-down mode. Each of the first logic level and the second logic level may be set to a logic high level or a logic low level according to an embodiment. The first buffer circuit 1 may generate the first internal chip select signal ICS1 by buffering the chip select signal CS in the normal operation mode. The first buffer circuit 1 may be embodied by a differential amplification circuit. The detailed configuration and operation of the first buffer circuit 1 will be described later with reference to FIG. 2.

The second buffer circuit 2 may generate a second internal chip select signal ICS2 in response to the select signal SEL and the chip select signal CS. The second buffer circuit 2 may generate the second internal chip select signal ICS2 by buffering the chip select signal CS in the state in which the select signal SEL is disabled. According to an embodiment, the second buffer circuit 2 may buffer an external command other than the chip select signal CS. The second buffer circuit 2 may generate the second internal chip select signal ICS2 by buffering the chip select signal CS in the power-down mode. The second buffer circuit 2 may be embodied as a CMOS (complementary metal oxide semiconductor) circuit. The detailed configuration and operation of the second buffer circuit 2 will be described later with reference to FIG. 3.

The command address buffer circuit 3 may generate an internal command address ICA in response to a buffer control signal BF_CNT and a command address CA. The command address buffer circuit 3 may generate the internal command address ICA by buffering the command address CA in response to the buffer control signal BF_CNT having a predetermined logic level which may indicate the power-down mode. The command address CA may include at least one of a command and an address. The command and address included in the command address CA may be transmitted through separate lines or common lines. The command address CA may include a plurality of bits according to an embodiment. The buffer control signal BF_CNT may have a first logic level in the normal operation mode and have a second logic level in the power-down mode. Each of the first logic level and the second logic level may be set to a logic high level or a logic low level according to an embodiment. The command address buffer circuit 3 may generate the internal command address ICA by buffering the command address CA in the normal operation mode. The command address buffer circuit 3 may be embodied by a differential amplification circuit. The detailed configuration and operation of the command address buffer circuit 3 will be described later with reference to FIG. 4.

The detection pulse generation circuit 4 may generate a detection pulse DETP in response to the second internal chip select signal ICS2. The detection pulse generation circuit 4 may generate the detection pulse DETP in synchronization with a predetermined edge of the second internal chip select signal ICS2. The detection pulse generation circuit 4 may generate the detection pulse DETP in synchronization with a time at which the second internal chip select signal ICS2 transitions from a logic high level to a logic low level, that is, a falling edge. According to an embodiment, the detection pulse generation circuit 4 may generate the detection pulse DETP in synchronization with a time at which the second internal chip select signal ICS2 transitions from the logic low level to the logic high level, that is, a rising edge. The detailed configuration and operation of the detection pulse generation circuit 4 will be described later with reference to FIG. 5.

The command decoder 5 may generate a power-down mode signal PD_INT in response to the internal command address ICA. The command decoder 5 may generate the power-down mode signal PD_INT by decoding the internal command address ICA. The power-down mode signal PD_INT may be enabled in the power-down mode.

The buffer control circuit 6 may generate the buffer control signal BF_CNT in response to the detection pulse DETP and the power-down mode signal PD_INT. The buffer control circuit 6 may generate the buffer control signal BF_CNT which transitions from a first logic level to a second logic level, in the case where the power-down mode signal PD_INT is enabled. The buffer control circuit 6 may generate the buffer control signal BF_CNT which transitions from the second logic level to the first logic level, in the case where the detection pulse DETP is generated. A detailed configuration and operation of the buffer control circuit 6 will be described later with reference to FIG. 6.

The delay circuit 7 may generate the select signal SEL in response to the buffer control signal BF_CNT which is delayed. A predetermined delay period by which the delay circuit 7 delays the buffer control signal BF_CNT may be set variously according to embodiments. According to an embodiment, the delay circuit 7 may be removed. The detailed configuration and operation of the delay circuit 7 will be described later with reference to FIG. 7.

Figure 2:
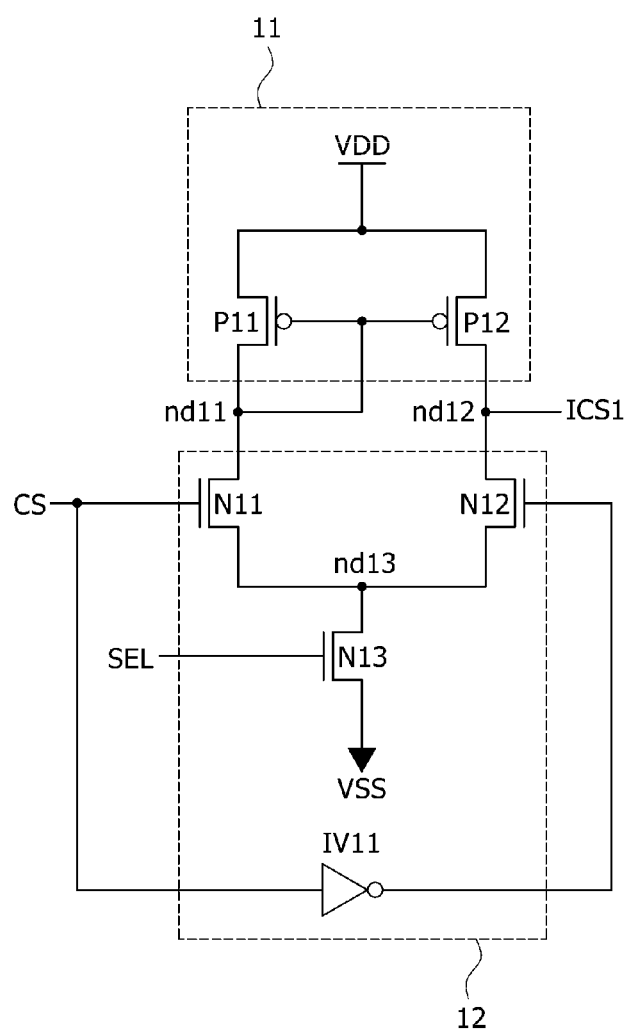
FIG. 2 is a circuit diagram illustrating a representation of an example of a first buffer circuit included in the semiconductor device shown in FIG. 1.

Referring to FIG. 2, the first buffer circuit 1 may include a first current mirror 11 and a first charge discharger 12.

The first current mirror 11 may include PMOS transistors P11 and P12 and operate as a constant current source. The PMOS transistor P11 may be coupled between a power supply voltage VDD and a node nd11, and may be turned on in response to the voltage of the node nd11. The PMOS transistor P12 may be coupled between the power supply voltage VDD and a node nd12, and may be turned on in response to the voltage of the node nd11. The first current mirror 11 may supply a current to the node nd11 and the node nd12.

The first charge discharger 12 may include NMOS transistor N11, N12, and N13 and an inverter IV11. The NMOS transistor N11 may be coupled between the node nd11 and a node nd13, and may be turned on in response to the chip select signal CS. The inverter IV11 may invert and buffer the chip select signal CS, and output an output signal. The NMOS transistor N12 may be coupled between the node nd12 and the node nd13, and may be turned on in response to the output signal of the inverter IV11. The NMOS transistor N13 may be coupled between the node nd13 and a ground voltage VSS, and may be turned on in response to the select signal SEL. The first charge discharger 12 may increase an amount of charges to be discharged through the node nd11 more than an amount of charges to be discharged through the node nd12, when the chip select signal CS is a logic high level with the select signal SEL being a logic high level, and thereby generate the first internal chip select signal ICS1 which is driven to a logic high level. The first charge discharger 12 may increase an amount of charges to be discharged through the node nd12 more than an amount of charges to be discharged through the node nd11, when the chip select signal CS is a logic low level with the select signal SEL being the logic high level, and thereby generate the first internal chip select signal ICS1 which is driven to a logic low level.

Figure 3:
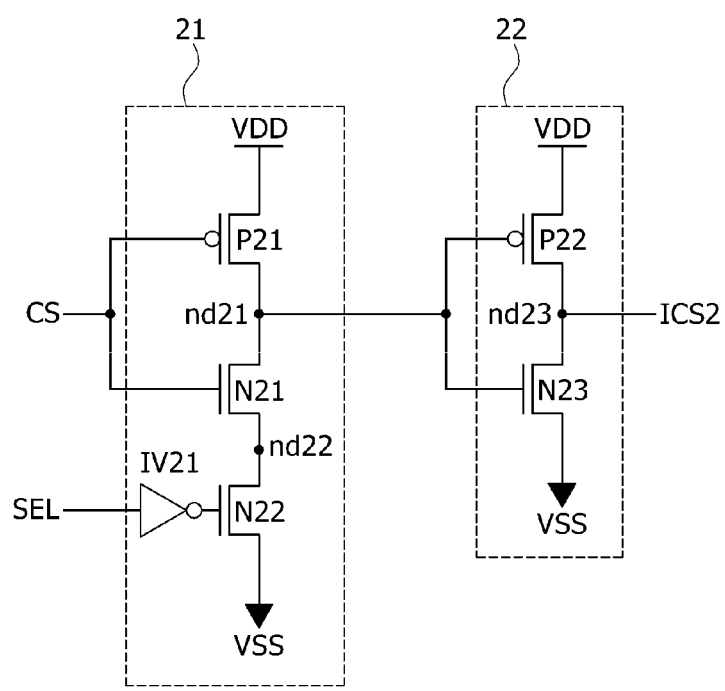
FIG. 3 is a circuit diagram illustrating a representation of an example of a second buffer circuit included in the semiconductor device shown in FIG. 1.

Referring to FIG. 3, the second buffer circuit 2 may include an input driver 21 and an output driver 22.

The input driver 21 may include a PMOS transistor P21, NMOS transistors N21 and N22, and an inverter IV21. The PMOS transistor P21 may be coupled between the power supply voltage VDD and a node nd21, and may be turned on in response to the chip select signal CS. The PMOS transistor P21 may be turned on in the case where the chip select signal CS of the logic low level is inputted, and pull-up drive the node nd21 to the power supply voltage VDD. The NMOS transistor N21 may be coupled between the node nd21 and a node nd22, and may be turned on in response to the chip select signal CS. The NMOS transistor N21 may be turned on to pull-down drive the node nd22 to the ground voltage VSS, in the case where the chip select signal CS of the logic high level is inputted. The NMOS transistor N22 may be coupled between the node nd22 and the ground voltage VSS, and may be turned on in response to the output signal of the inverter IV21 which inverts and buffers the select signal SEL. The NMOS transistor N22 may be turned on in the case where the select signal SEL is a logic low level, and pull-down drive the node nd22 to the ground voltage VSS.

The output driver 22 may include a PMOS transistor P22 and an NMOS transistor N23. The PMOS transistor P22 may be coupled between the power supply voltage VDD and a node nd23, and may be turned on in response to the signal of the node nd21. The PMOS transistor P22 may be turned on in the case where a logic low level signal of the node nd21 is inputted, and pull-up drive the node nd23 through which the second internal chip select signal ICS2 is outputted, to the power supply voltage VDD. The NMOS transistor N23 may be coupled between the node nd23 and the ground voltage VSS, and may be turned on in response to the signal of the node nd21. The NMOS transistor N23 may be turned on in the case where the signal of the node nd21 is a logic high level, and pull-down drive the node nd23 through which the second internal chip select signal ICS2 is outputted, to the ground voltage VSS.

Figure 4:
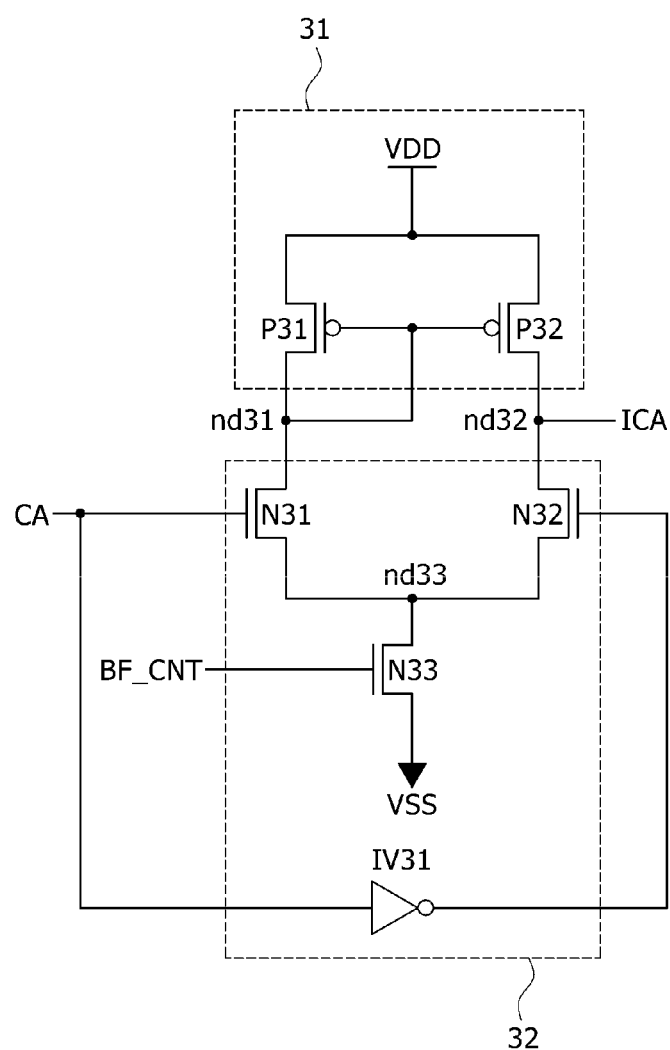
FIG. 4 is a circuit diagram illustrating a representation of an example of a command address buffer circuit included in the semiconductor device shown in FIG. 1.

Referring to FIG. 4, the command address buffer circuit 3 may include a second current mirror 31 and a second charge discharger 32.

The second current mirror 31 may include PMOS transistors P31 and P32 and operate as a constant current source. The PMOS transistor P31 may be coupled between the power supply voltage VDD and a node nd31, and may be turned on in response to the voltage of the node nd31. The PMOS transistor P32 may be coupled between the power supply voltage VDD and a node nd32, and may be turned on in response to the voltage of the node nd32.

The second charge discharger 32 may include NMOS transistor N31, N32, and N33 and an inverter IV31. The NMOS transistor N31 may be coupled between the node nd31 and a node nd33, and may be turned on in response to the command address CA. The inverter IV31 may invert and buffer the command address CA, and output an output signal. The NMOS transistor N32 may be coupled between the node nd32 and the node nd33, and may be turned on in response to the output signal of the inverter IV31. The NMOS transistor N33 may be coupled between the node nd33 and the ground voltage VSS, and may be turned on in response to the buffer control signal BF_CNT. The second charge discharger 32 may increase an amount of charges to be discharged through the node nd31 more than an amount of charges to be discharged through the node nd32, in the case where the command address CA is a logic high level with the buffer control signal BF_CNT being a logic high level, and thereby generate the internal command address ICA which is driven to a logic high level. The second charge discharger 32 may increase an amount of charges to be discharged through the node nd32 more than an amount of charges to be discharged through the node nd31, in the case where the command address CA is a logic low level with the buffer control signal BF_CNT being the logic high level, and thereby generate the internal command address ICA which is driven to a logic low level.

Figure 5:
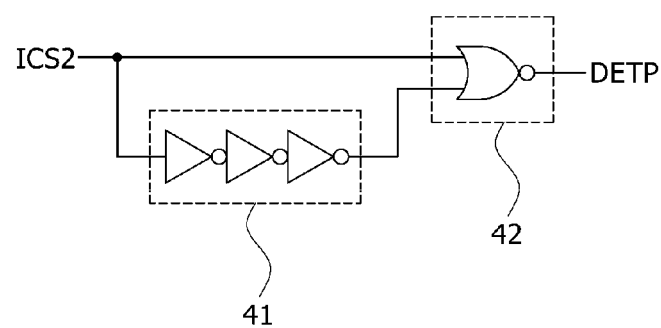
FIG. 5 is a circuit diagram illustrating a representation of an example of a detection pulse generation circuit included in the semiconductor device shown in FIG. 1.

Referring to FIG. 5, the detection pulse generation circuit 4 may include an inverting delay 41 and a pulse output 42. The inverting delay 41 may be embodied by an inverter chain which includes an odd number of inverters. The inverting delay 41 may invert and then delay the second internal chip select signal ICS2, and output an output signal. The pulse output 42 may generate the detection pulse DETP in response to the output signal of the inverting delay 41 and the second internal chip select signal ICS2. The pulse output 42 may be inputted with the output signal of the inverting delay 41 and the second internal chip select signal ICS2, and perform a NOR logic function. The pulse output 42 may generate the detection pulse DETP in synchronization with a time that both the output signal of the inverting delay 41 and the second internal chip select signal ICS2 are set to logic low levels. The pulse output 42 may generate the detection pulse DETP in synchronization with a time that the second internal chip select signal ICS2 transitions from the logic high level to the logic low level. The pulse width of the detection pulse DETP is set to a delay period that is set by the inverting delay 41.

Figure 6:
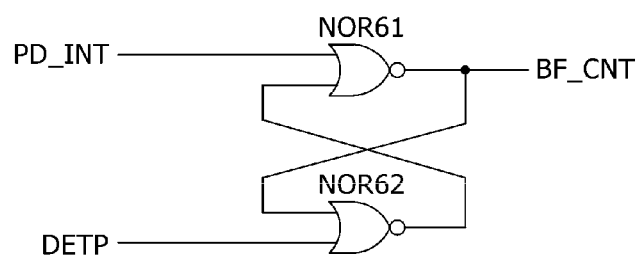
FIG. 6 is a circuit diagram illustrating a representation of an example of a buffer control circuit included in the semiconductor device shown in FIG. 1.

Referring to FIG. 6, the buffer control circuit 6 may be embodied by an SR latch which includes NOR gates NOR61 and NOR62. The NOR gate NOR61 may be inputted with the power-down mode signal PD_INT and an output signal of the NOR gate NOR62, perform a NOR logic function, and generate the buffer control signal BF_CNT. The NOR gate NOR62 may be inputted with the detection pulse DETP and the buffer control signal BF_CNT, perform a NOR logic function, and generate the output signal of the NOR gate NOR62. The buffer control circuit 6 may generate the buffer control signal BF_CNT which is set to a logic low level, in the case where the power-down mode signal PD_INT is enabled to a logic high level. The buffer control circuit 6 may generate the buffer control signal BF_CNT which transitions from the logic low level to the logic high level, in the case where the detection pulse DETP is generated in the state in which the power-down mode signal PD_INT is a logic low level.

Figure 7:
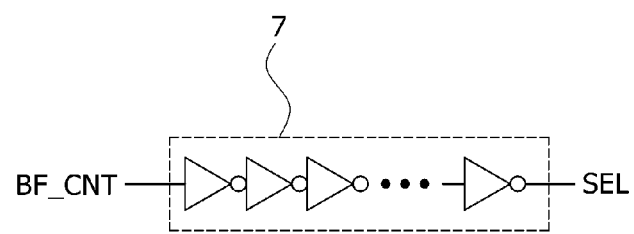
FIG. 7 is a circuit diagram illustrating a representation of an example of a delay circuit included in the semiconductor device shown in FIG. 1.

Referring to FIG. 7, the delay circuit 7 may be embodied by an inverter chain. The delay circuit 7 may generate the select signal SEL by delaying the buffer control signal BF_CNT. A delay period by which the delay circuit 7 delays the buffer control signal BF_CNT is determined depending on the inverter chain.

Figure 8:
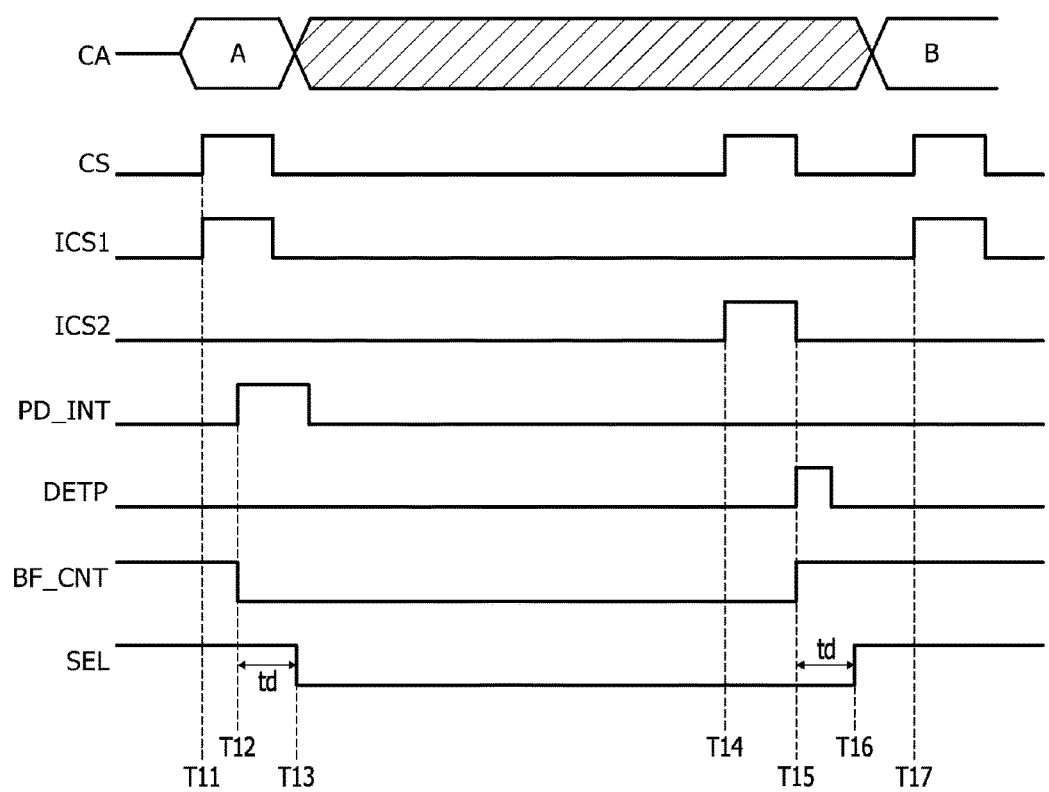
FIG. 8 is a representation of an example of a timing diagram to assist in an explanation of the operation of the semiconductor device in accordance with the embodiment.

The operation of the semiconductor device configured as mentioned above will be described below with reference to FIG. 8.

At a time T11, a first pulse of the chip select signal CS which is inputted is buffered, and is selected and outputted as the first internal chip select signal ICS1 in response to the select signal SEL of the logic high level.

At a time T12, in the state in which the pulse of the first internal chip select signal ICS1 is generated, the command address CA having a first combination A is decoded, and thereby the power-down mode signal PD_INT is enabled. The logic level of the buffer control signal BF_CNT transitions from the logic high level to the logic low level in response to the power-down mode signal PD_INT which is enabled and the power-down mode may be entered. After the power-down mode is entered at the time T12, the buffer control signal BF_CNT is set to the logic low level. In response to the buffer control signal BF_CNT which is set to the logic low level, the command address buffer circuit 3 interrupts the operation of generating the internal command address ICA by buffering the command address CA. The select signal SEL transitions from the logic high level to the logic low level in synchronization with a time T13 when a predetermined delay period td passes from the time T12 at which the buffer control signal BF_CNT is set to the logic low level. In response to the select signal SEL which is set to the logic low level, the operation of the first buffer circuit 1 which is embodied by a differential amplification circuit is interrupted, and the second buffer circuit 2 which is embodied as a CMOS circuit operates.

At a time T14, a second pulse of the chip select signal CS which is inputted is buffered, and is selected and outputted as the second internal chip select signal ICS2 in response to the select signal SEL of the logic low level.

At a time T15, the detection pulse DETP is generated in synchronization with a time that the second internal chip select signal ICS2 transitions from the logic high level to the logic low level, that is, at a falling edge of the second internal chip select signal ICS2. The logic level of the buffer control signal BF_CNT transitions from the logic low level to the logic high level in the case where the detection pulse DETP is generated. In response to the buffer control signal BF_CNT which is set to the logic high level, the command address buffer circuit 3 performs the operation of generating the internal command address ICA by buffering the command address CA. The select signal SEL transitions from the logic low level to the logic high level in synchronization with a time T16 when the predetermined delay period td passes from the time T15 that the buffer control signal BF_CNT is set to the logic high level. In response to the select signal SEL which is set to the logic high level, the operation of the second buffer circuit 2 which is embodied as a CMOS circuit is interrupted, and the first buffer circuit 1 which is embodied by a differential amplification circuit operates.

At a time T17, a third pulse of the chip select signal CS which is inputted is buffered, and is selected and outputted as the first internal chip select signal ICS1 in response to the select signal SEL of the logic high level. In the state in which the pulse of the first internal chip select signal ICS1 is generated, the command address CA having a second combination B is decoded, and thereby a predetermined operation may be performed or a predetermined mode may be entered. The operation and mode which are performed and entered when the command address CA having the second combination B is inputted may be set variously according to embodiments.

In the semiconductor device according to the present embodiment, because the power-down mode may be exited in response to the chip select signal CS, a layout area may be reduced by removing pins through which a clock enable signal (CKE) is inputted. In the semiconductor device according to the present embodiment, because a buffer to which the chip select signal CS is inputted in the power-down mode is changed from a differential amplification circuit to a CMOS circuit, current consumption may be reduced. In the semiconductor device according to the present embodiment, because a buffer to which the command address CA is inputted is enabled after exiting the power-down mode in response to the chip select signal CS, it is possible to prevent the command address CA which is unstable, from being inputted when exiting the power-down mode.

Figure 9:
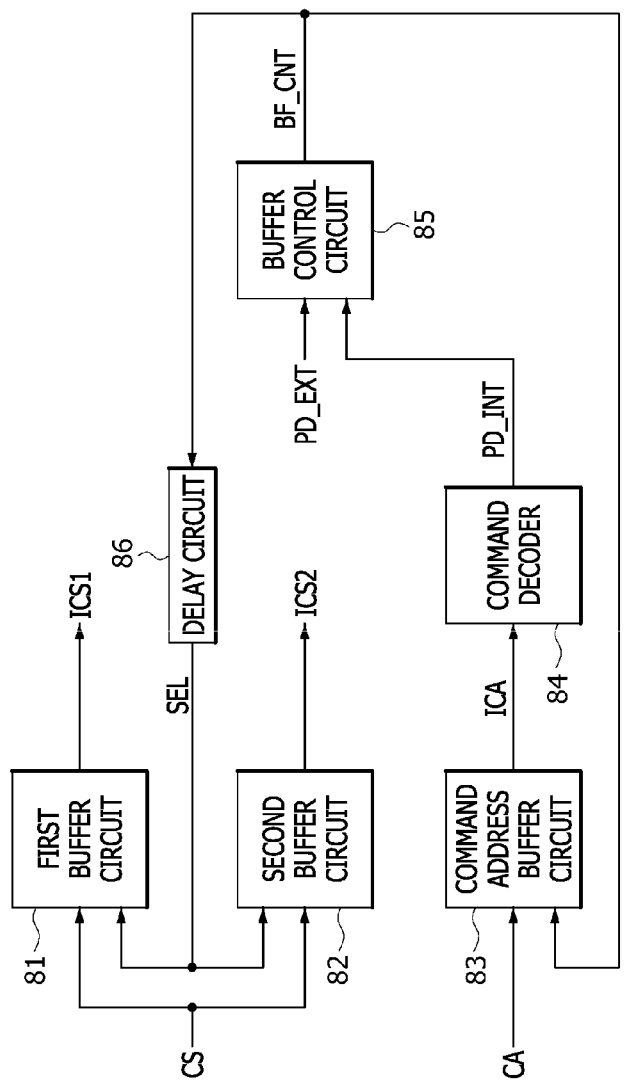
FIG. 9 is a block diagram illustrating a representation of an example of a configuration of a semiconductor device in accordance with another embodiment.

As shown in FIG. 9, a semiconductor device in accordance with another embodiment may include a first buffer circuit 81, a second buffer circuit 82, a command address buffer circuit 83, a command decoder 84, a buffer control circuit 85, and a delay circuit 86.

The first buffer circuit 81 may generate a first internal chip select signal ICS1 in response to a select signal SEL and a chip select signal CS. The first buffer circuit 81 may generate the first internal chip select signal ICS1 by buffering the chip select signal CS in the state in which the select signal SEL has a predetermined logic level. The chip select signal CS may be a command which is enabled to select a chip (not shown) including the semiconductor device. According to an embodiment, the first buffer circuit 81 may buffer a command other than the chip select signal CS. The select signal SEL may have a first logic level in a normal operation mode and have a second logic level in a power-down mode. The normal operation mode means modes excluding a low power consumption mode such as the power-down mode. Each of the first logic level and the second logic level may be set to a logic high level or a logic low level according to an embodiment. The first buffer circuit 81 may generate the first internal chip select signal ICS1 by buffering the chip select signal CS in response to the select signal SEL in the normal operation mode. The first buffer circuit 81 may be embodied by a differential amplification circuit. The first buffer circuit 81 may be embodied by the circuit illustrated in FIG. 2.

The second buffer circuit 82 may generate a second internal chip select signal ICS2 in response to the select signal SEL and the chip select signal CS. The second buffer circuit 82 may generate the second internal chip select signal ICS2 by buffering the chip select signal CS in the state in which the select signal SEL is disabled. According to an embodiment, the second buffer circuit 82 may buffer an external command other than the chip select signal CS. The second buffer circuit 82 may generate the second internal chip select signal ICS2 by buffering the chip select signal CS in response to the select signal SEL in the power-down mode. The second buffer circuit 82 may be embodied as a CMOS (complementary metal oxide semiconductor) circuit. The second buffer circuit 82 may be embodied by the circuit illustrated in FIG. 3.

The command address buffer circuit 83 may generate an internal command address ICA in response to a buffer control signal BF_CNT and a command address CA. The command address buffer circuit 83 may generate the internal command address ICA by buffering the command address CA in the state in which the buffer control signal BF_CNT has a predetermined logic level. The command address CA may include at least one of a command and an address. The command and address included in the command address CA may be transmitted through separate lines or common lines. The command address CA may include a plurality of bits according to an embodiment. The buffer control signal BF_CNT may have a first logic level in the normal operation mode and have a second logic level in the power-down mode. Each of the first logic level and the second logic level may be set to a logic high level or a logic low level according to an embodiment. The command address buffer circuit 83 may generate the internal command address ICA by buffering the command address CA in the normal operation mode. The command address buffer circuit 83 may be embodied by a differential amplification circuit. The command address buffer circuit 83 may be embodied by the circuit illustrated in FIG. 4.

The command decoder 84 may generate a power-down mode signal PD_INT in response to the internal command address ICA. The command decoder 84 may generate the power-down mode signal PD_INT by decoding the internal command address ICA. The power-down mode signal PD_INT may be enabled in the power-down mode.

The buffer control circuit 85 may generate the buffer control signal BF_CNT in response to the power-down mode signal PD_INT and a power-down mode exit signal PD_EXT. The buffer control circuit 85 may generate the buffer control signal BF_CNT which transitions from a first logic level to a second logic level, in the case where the power-down mode signal PD_INT is enabled in the power-down mode. The buffer control circuit 85 may generate the buffer control signal BF_CNT which transitions from the second logic level to the first logic level, in the case where the power-down mode exit signal PD_EXT is generated as enabled in the normal operation mode. The power-down mode exit signal PD_EXT may be generated inside the semiconductor device or be applied from an exterior of the semiconductor device. The detailed configuration and operation of the buffer control circuit 85 will be described later with reference to FIG. 10.

The delay circuit 86 may generate the select signal SEL by delaying the buffer control signal BF_CNT. A delay period by which the delay circuit 86 delays the buffer control signal BF_CNT may be set variously according to embodiments. According to an embodiment, the delay circuit 86 may be removed and the buffer control signal BF_CNT may be communicated to the first buffer circuit 81 and the second buffer circuit 82 as the select signal SEL.

Figure 10:
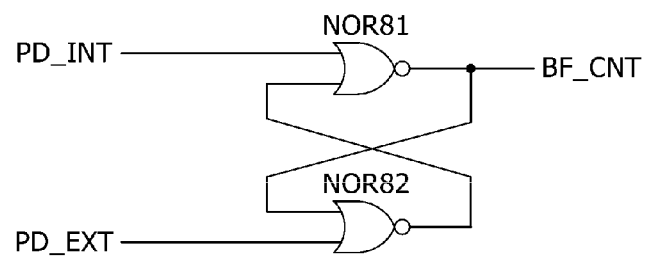
FIG. 10 is a circuit diagram illustrating a representation of an example of a buffer control circuit included in the semiconductor device shown in FIG. 9.

Referring to FIG. 10, the buffer control circuit 85 may be embodied by an SR latch which includes NOR gates NOR81 and NOR82. The NOR gate NOR81 may be inputted with the power-down mode signal PD_INT and an output signal of the NOR gate NOR82, perform a NOR logic function, and generate the buffer control signal BF_CNT. The NOR gate NOR82 may be inputted with the power-down mode exit signal PD_EXT and the buffer control signal BF_CNT, perform a NOR logic function, and generate the output signal of the NOR gate NOR82. The buffer control circuit 85 may generate the buffer control signal BF_CNT which is set to a logic low level, in the case where the power-down mode signal PD_INT is enabled to a logic high level. The buffer control circuit 85 may generate the buffer control signal BF_CNT which transitions from the logic low level to a logic high level, in the case where the power-down mode exit signal PD_EXT is generated in the state in which the power-down mode signal PD_INT is a logic low level.

Figure 11:
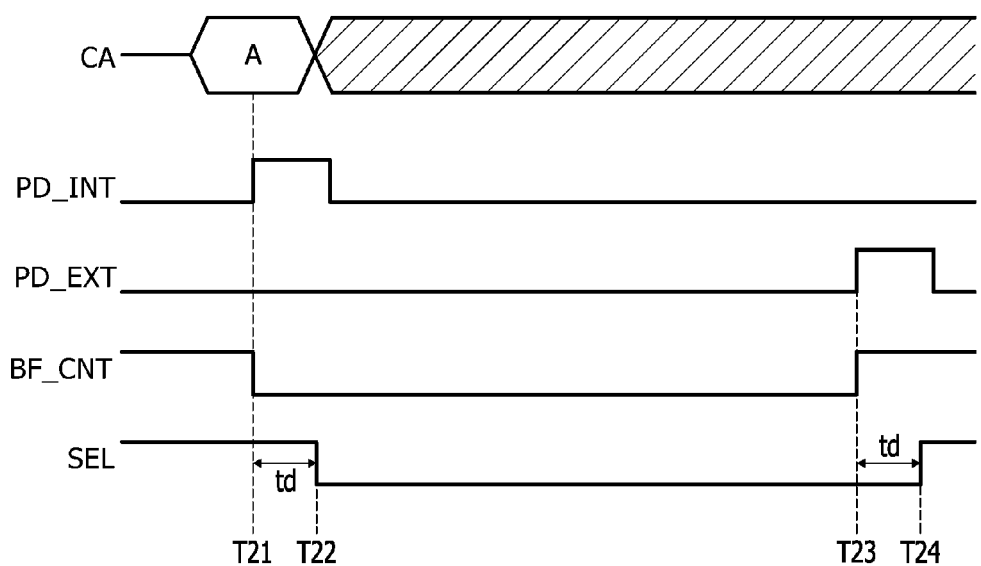
FIG. 11 is a representation of an example of a timing diagram to assist in an explanation of the operation of the semiconductor device in accordance with another embodiment.

The operation of the semiconductor device configured as mentioned above will be described below with reference to FIG. 11.

At a time T21, the command address CA having a first combination A is decoded, and thereby the power-down mode signal PD_INT is enabled. The logic level of the buffer control signal BF_CNT transitions from the logic high level to the logic low level in response to the power-down mode signal PD_INT which is enabled. After the power-down mode is entered at the time T21, the buffer control signal BF_CNT is set to the logic low level. In response to the buffer control signal BF_CNT which is set to the logic low level, the command address buffer circuit 83 interrupts the operation of generating the internal command address ICA by buffering the command address CA. The select signal SEL transitions from a logic high level to a logic low level in synchronization with a time T22 when a predetermined delay period td passes from the time T21 at which the buffer control signal BF_CNT is set to the logic low level. In response to the select signal SEL which is set to the logic low level, the operation of the first buffer circuit 81 which is embodied by a differential amplification circuit is interrupted, and the second buffer circuit 82 which is embodied as a CMOS circuit operates.

At a time T23, as the power-down mode exit signal PD_EXT which is enabled to a logic high level is generated, the logic level of the buffer control signal BF_CNT transitions from the logic low level to the logic high level. After the power-down mode is exited at the time T23, the buffer control signal BF_CNT is set to the logic high level. In response to the buffer control signal BF_CNT which is set to the logic high level, the command address buffer circuit 83 performs the operation of generating the internal command address ICA by buffering the command address CA. The select signal SEL transitions from the logic low level to the logic high level in synchronization with a time T24 when the predetermined delay period td passes from the time T23 at which the buffer control signal BF_CNT is set to the logic high level. In response to the select signal SEL which is set to the logic high level, the operation of the second buffer circuit 82 which is embodied as a CMOS circuit is interrupted, and the first buffer circuit 81 which is embodied by a differential amplification circuit operates.

In the semiconductor device according to the present embodiment, because the power-down mode may be exited in response to the chip select signal CS, a layout area may be reduced by removing pins through which a clock enable signal (CKE) is inputted. In the semiconductor device according to the present embodiment, because a buffer to which the chip select signal CS is inputted in the power-down mode is changed from a differential amplification circuit to a CMOS circuit, current consumption may be reduced. In the semiconductor device according to the present embodiment, because a buffer to which the command address CA is inputted is enabled after exiting the power-down mode in response to the chip select signal CS, it is possible to prevent the command address CA which is unstable, from being inputted when exiting the power-down mode.

Figure 12:
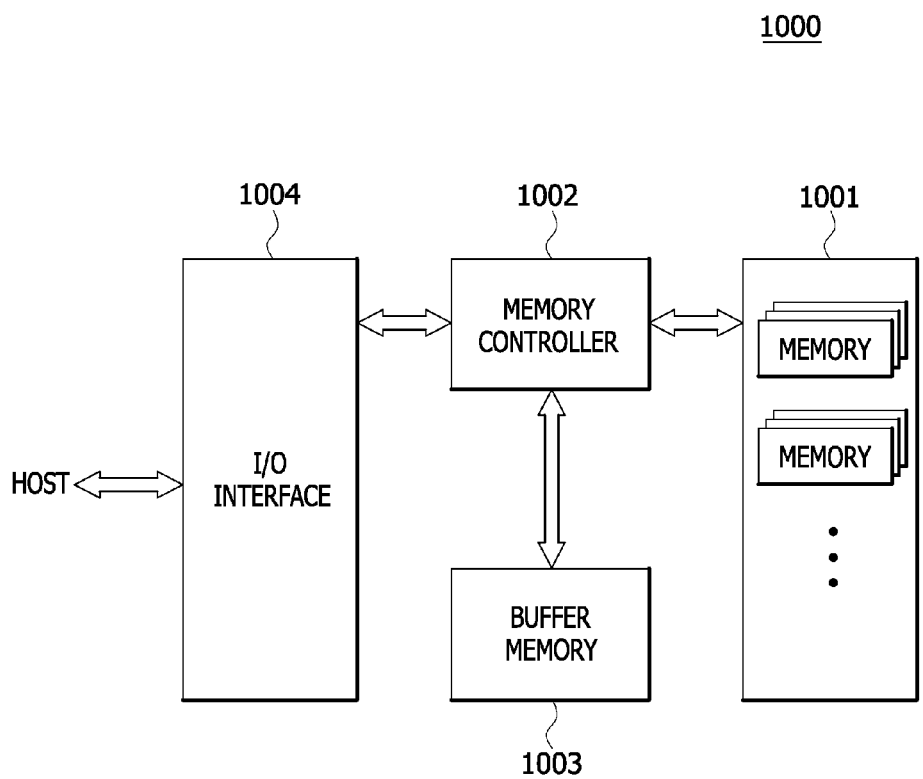
FIG. 12 is a diagram illustrating a representation of an example of a configuration of an electronic system to which each of the semiconductor devices shown in FIGS. 1 and 9 is applied.

Each of the semiconductor devices described above with reference to FIGS. 1 and 9 may be applied to an electronic system which includes a memory system, a graphic system, a computing system, or a mobile system. For example, referring to FIG. 12, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include each of the semiconductor devices shown in FIGS. 1 and 9. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 12, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI, and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    a buffer control circuit for receiving a power-down mode signal and a detection pulse to generate a buffer control signal;
    a first buffer circuit for generating a first internal chip select signal by buffering a chip select signal depending on a select signal which is generated in response to the buffer control signal, in a power-down mode; and
    a detection pulse generation circuit for receiving the first internal chip select signal to generate the detection pulse.

2. The semiconductor device according to claim 1, wherein the power-down mode signal is enabled in the power-down mode.

3. The semiconductor device according to claim 1, wherein the buffer control signal has a first logic level in the case where the power-down mode signal is enabled, and has a second logic level in the case where the detection pulse is generated.

4. The semiconductor device according to claim 1, wherein the select signal is generated by delaying the buffer control signal by a predetermined delay period.

5. The semiconductor device according to claim 1, wherein the first buffer circuit is embodied as a CMOS (complementary metal oxide semiconductor) circuit.

6. The semiconductor device according to claim 1, wherein the first buffer circuit comprises:
    an input driver suitable for driving an input node in response to the select signal and the chip select signal; and
    an output driver suitable for driving an output node through which the first internal chip select signal is outputted, in response to a signal of the input node.

7. The semiconductor device according to claim 1, wherein the detection pulse is generated in synchronization with a predetermined edge of the first internal chip select signal.

8. The semiconductor device according to claim 1, further comprising:
    a second buffer circuit for generating a second internal chip select signal by buffering the chip select signal depending on the select signal.

9. The semiconductor device according to claim 8, wherein the second buffer circuit is embodied by a differential amplification circuit.

10. The semiconductor device according to claim 8, wherein the second buffer circuit comprises:
    a current mirror suitable for supplying current to a first node and a second node; and
    a charge discharger suitable for differentially discharging charges of the first node and charges of the second node depending on a logic level of the chip select signal.

11. The semiconductor device according to claim 1, further comprising:
    a command address buffer circuit for generating an internal command address by buffering a command address in response to the buffer control signal.

* * * * *